(12) United States Patent
Tanaka

(10) Patent No.: US 9,503,662 B2
(45) Date of Patent: Nov. 22, 2016

(54) SOLID-STATE IMAGING DEVICE AND CAMERA SYSTEM

(71) Applicant: Sony Corporation, Tokyo (JP)

(72) Inventor: Kenichi Tanaka, Nagasaki (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 14/949,411

(22) Filed: Nov. 23, 2015

(65) Prior Publication Data
US 2016/0088246 A1 Mar. 24, 2016

Related U.S. Application Data

(63) Continuation of application No. 14/738,137, filed on Jun. 12, 2015, now Pat. No. 9,288,417, which is a continuation of application No. 14/598,563, filed on Jan. 16, 2015, now Pat. No. 9,131,179, which is a (Continued)

(30) Foreign Application Priority Data

Nov. 15, 2007 (JP) .................................. 2007-297269

(51) Int. Cl.
*H04N 5/369* (2011.01)
*H04N 5/335* (2011.01)
(Continued)

(52) U.S. Cl.
CPC .......... *H04N 5/3698* (2013.01); *H04N 5/2253* (2013.01); *H04N 5/335* (2013.01); *H04N 5/378* (2013.01); *H04N 5/3741* (2013.01); *H04N 5/3742* (2013.01); *H04N 5/37457* (2013.01)

(58) Field of Classification Search
CPC .. H04N 5/2253; H04N 5/335; H04N 5/3698; H04N 5/3742; H04N 5/37457; H04N 5/378
See application file for complete search history.

(56) References Cited

U.S. PATENT DOCUMENTS 4,847,524 A 7/1989 Van Rooy et al.
4,852,164 A * 7/1989 Suzuki ................. H04N 7/1713
327/68

(Continued)

FOREIGN PATENT DOCUMENTS

JP 07-079122 3/1995
JP 07-094953 4/1995

(Continued)

OTHER PUBLICATIONS

Yang et al., "An Integrated 800x600 CMOS Image System", ISSCC Digest of Technical Papers, pp. 304-305, Feb. 1999.

(Continued)

*Primary Examiner* — Amy Hsu
(74) *Attorney, Agent, or Firm* — Michael Best & Friedrich LLP

(57) ABSTRACT

A solid-state imaging device and a camera system are disclosed. The solid-state imaging device includes a pixel unit and a pixel signal readout circuit. The pixel signal readout circuit includes a plurality of comparators disposed to correspond to a pixel column array, and a plurality of counters. Each counter includes a first amplifier, a second amplifier, and a mirror circuit to from a current mirror in parallel with the second amplifier. The first amplifier includes differential transistors, initializing switches connected between gates and collectors of the differential transistors, and first and second capacitors connected to each of the gates of the differential transistors. The second amplifier includes an initializing switch and a third capacitor. The mirror circuit includes a gate input transistor whose gate is inputted with a voltage sampled by the first amplifier or a voltage sampled by the second amplifier.

26 Claims, 10 Drawing Sheets

Related U.S. Application Data continuation of application No. 14/576,914, filed on Dec. 19, 2014, now abandoned, which is a continuation of application No. 14/470,636, filed on Aug. 27, 2014, now Pat. No. 8,964,078, which is a continuation of application No. 13/437,637, filed on Apr. 2, 2012, now Pat. No. 8,854,516, which is a continuation of application No. 12/259,707, filed on Oct. 28, 2008, now Pat. No. 8,149,309.

(51) Int. Cl.
*H04N 5/374* (2011.01)
*H04N 5/378* (2011.01)
*H04N 5/3745* (2011.01)
*H04N 5/225* (2006.01)

(56) References Cited

U.S. PATENT DOCUMENTS

| | | | |
|---|---|---|---|
| 5,345,277 A | 9/1994 | Blankevoort et al. | |
| 5,995,166 A | 11/1999 | Kawano | |
| 6,201,270 B1 * | 3/2001 | Chen | H01L 27/14609 250/214.1 |
| 6,366,136 B1 * | 4/2002 | Page | H03K 3/3565 327/205 |
| 6,384,413 B1 * | 5/2002 | Pain | G01J 1/46 250/330 |
| 6,777,660 B1 * | 8/2004 | Lee | H01L 27/14609 250/208.1 |
| 7,623,173 B2 * | 11/2009 | Nitta | H03M 1/1023 348/297 |
| 7,728,898 B2 * | 6/2010 | Lee | H01L 27/14609 257/239 |
| 2001/0007151 A1 | 7/2001 | Vorenkamp et al. | |
| 2002/0047942 A1 | 4/2002 | Vorenkamp et al. | |
| 2004/0017494 A1 | 1/2004 | Lu et al. | |
| 2004/0223064 A1 * | 11/2004 | Sato | H04N 5/3575 348/255 |
| 2005/0001686 A1 * | 1/2005 | Splithof | H04N 5/148 330/288 |
| 2005/0057675 A1 * | 3/2005 | Lee | H04N 5/3597 348/308 |
| 2005/0195304 A1 | 9/2005 | Nitta et al. | |
| 2007/0046795 A1 * | 3/2007 | Yamashita | H03M 1/123 348/294 |
| 2007/0158531 A1 * | 7/2007 | Knee | H04N 3/155 250/208.1 |
| 2007/0188640 A1 * | 8/2007 | Xu | H04N 3/155 348/308 |
| 2008/0111905 A1 * | 5/2008 | Toyama | H04N 5/3742 348/308 |

FOREIGN PATENT DOCUMENTS

| | | |
|---|---|---|
| JP | 2005-278135 A | 10/2005 |
| JP | 2007-019682 A | 1/2007 |
| JP | 2007-281540 A | 10/2007 |

OTHER PUBLICATIONS

Korean Office Action issued Oct. 28, 2014 for corresponding Korean Application No. 10-2008-0112667.

\* cited by examiner

SOLID-STATE IMAGING DEVICE AND CAMERA SYSTEM

CROSS-REFERENCE TO RELATED APPLICATIONS

This application is a Continuation of application Ser. No. 14/738,137, filed on Jun. 12, 2015, which is a Continuation of application Ser. No. 14/598,563, filed on Jan. 16, 2015, now U.S. Pat. No. 9,131,179, issued on Sep. 8, 2015, which is a Continuation of application Ser. No. 14/576,914, filed on Dec. 19, 2014, which is a Continuation of application Ser. No. 14/470,636, filed on Aug. 27, 2014, now U.S. Pat. No. 8,964,078, issued on Feb. 24, 2015, which is a Continuation of application Ser. No. 13/437,637, filed on Apr. 2, 2012, now U.S. Pat. No. 8,854,516, issued on Oct. 7, 2014, which is a Continuation of application Ser. No. 12/259,707, filed on Oct. 28, 2008, now U.S. Pat. No. 8,149,309, issued on Apr. 3, 2012, which claims priority to Japanese Patent Application Number 2007-297269 filed in the Japanese Patent Office on Nov. 15, 2007, the entire disclosure of which is incorporated herein by reference.

BACKGROUND OF THE INVENTION

1. Field of the Invention

The present invention relates to a solid-state imaging device as typified by a CMOS image sensor, and a camera system.

2. Description of Related Art

In recent years, a complementary metal-oxide semiconductor (CMOS) image sensor has been paid attention as a solid-state imaging device (image sensor) to be substituted for charge-coupled device (CCD).

This is because the CMOS image sensor overcomes various issues of CCD, including the necessity for dedicated processes for manufacturing CCD pixels and for a plurality of power supply voltages for CCD operation, and a very complicated system because a plurality of peripheral ICs are required to be combined for the operation.

A CMOS image sensor has a plurality of large merits: manufacturing processes similar to those for a general CMOS type integrated circuit can be used for manufacturing CMOS image sensors, a single power supply can drive a CMOS image sensor, and the number of peripheral ICs can be reduced because analog circuits and logic circuits manufactured by CMOS processes can be used being mixed on the same chip.

A main trend of a CCD output circuit is one channel (1-ch) output by using a floating diffusion (FD) amplifier having an FD layer.

In contrast, a main trend of a CMOS image sensor is a column parallel type in which each pixel is provided with an FD amplifier, and by selecting each row of a pixel array, and outputs of FD amplifiers are read in a column direction at the same time.

This is because it is considered that the FD amplifier disposed in each pixel is difficult to obtain a sufficient drive capability, resulting in a need for lowering the data rate, so that that parallel processing is advantageous.

Various signal output circuits have been truly proposed for a column parallel output type CMOS image sensor.

As a method used for pixel signal readout operation of the CMOS image sensor, there is a method by which signal charges to be used as an optical signal generated by a photoelectric conversion element, such as a photodiode, are sampled temporarily via a MOS switch disposed near the photoelectric conversion element in a capacitor, and the signal charges are read out.

Noises having inverse correlation to a sampling capacitor value are generally superposed upon a sampling circuit. In a pixel, when signal charges are transferred to the sampling capacitor, the signal charges are fully transferred by utilizing a potential gradient so that noises will occur at the sampling stage. However, noises are superposed when a voltage level of capacitor is reset to a reference value, which is the previous stage of the sampling.

In order to remove the noises, a correlated double sampling (CDS) is generally used. With this method, a state (reset level) immediately before sampling signal charges is read out and stored, and then a signal level after sampling is read out so that the read out signal level is subtracted from that of the stored charges, thereby eliminating the noises.

There are various specific methods of the CDS.

A general CMOS image sensor will be described below.

FIG. 1 is a diagram showing an example of a pixel of a CMOS image sensor composed of four transistors.

This pixel 10 includes a photodiode 11, for example, as a photoelectric conversion element, and four transistors as active elements for one photodiode 11. The four transistors include a transfer transistor 12, an amplifier transistor 13, a select transistor 14, and a reset transistor 15.

The photodiode 11 photoelectrically converts an incident light into an amount of electric charge (here, it is an electron) corresponding to the amount of the incident light.

The transfer transistor 12 is connected between the photodiode 11 and a floating diffusion FD. Upon application of a drive signal to the gate (transfer gate) of the transfer transistor via a transfer control line LTx, the transfer transistor 12 transfers the electrons photoelectrically converted by the photodiode 11 to the floating diffusion FD.

A gate of the amplifier transistor 13 is connected to the floating diffusion FD. The amplifier transistor 13 is connected to a signal line LSGN via the selection transistor 14. The amplifier transistor 13 and a constant power supply 16 located outside the pixel unit constitute a source follower.

Through the select control line LSEL, an address signal is supplied to the gate of the selection transistor 14, and when the selection transistor 14 turns on, the amplifier transistor 13 amplifies a potential of the floating diffusion to output a voltage corresponding to the potential to the output (vertical) signal line LSGN. The signal voltage outputted from each pixel is outputted to a pixel signal readout circuit via the signal line LSGN.

The reset transistor 15 is connected between a power supply line LVDD and the floating diffusion FD. When a reset signal is supplied to the gate of the reset transistor via a reset control line LRST, the reset transistor resets a potential of the floating diffusion FD to a potential of the power supply line LVDD.

More specifically, when the pixel is reset, the transfer transistor 12 is turned on to sweep-out charges accumulated in the photoelectric conversion element 11, and then the transfer transistor 12 is turned off to make the photoelectric conversion element 11 convert an optical signal into charges and accumulate the charges.

When the pixel is read out, the reset transistor 15 is turned on to reset the floating diffusion FD, and then the reset transistor 15 is turned off to output a voltage of the floating diffusion FD via the amplifier transistor 13 and the selection transistor 14. The output at this time is defined as a P-phase voltage.

Next, the transfer transistor 12 is turned on to transfer charges accumulated in the photoelectric conversion element 22 to the floating diffusion FD, and a voltage of the floating diffusion FD is outputted by the amplifier transistor 13. The output at this time is defined as a D-phase output.

By using a difference between the D-phase output and the P-phase output as an image signal, it becomes possible to remove not only variations in DC component of the output per each pixel but also a FD reset noise of the floating diffusion from the image signal.

These operations are performed for pixels of one row at a time because the respective gates of, e.g., the transfer transistor 12, the selection transistor 14, and the reset transistor 15 are connected in units of the row.

Various pixel signal readout (output) circuits of a column parallel output type CMOS image sensor have been proposed. One of the most advanced types of this circuit has an analog-digital converter unit (hereinafter abbreviated to ADC (analog digital converter)) disposed for each column to output a pixel signal as a digital signal.

A CMOS image sensor employing the column parallel ADC of this type is disclosed, for example, in W. Yang et. al., "An integrated 800.times.600 CMOS Image System" ISSCC Digest of Technical Papers, pp. 304 and 305, February, 199) and Japanese Unexamined Patent Application Publication No. 2005-278135.

FIG. 2 is a block diagram showing a configuration example of the solid-state imaging device (CMOS image sensor) employing a column parallel ADC.

As shown in FIG. 2, the solid-state imaging device 20 includes a pixel unit 21 as an imaging unit, a vertical scanning circuit 22, a horizontal transfer scanning circuit 23, a timing control circuit 24, an ADC group 25, a digital-analog conversion unit (hereinafter abbreviated to DAC (digital-analog converter)) 26, an amplifier circuit (S/A) 27, and a signal processing circuit 28.

The pixel unit 21 includes photodiodes and intra-pixel amplifiers, and is constituted of pixels such as shown in FIG. 1 disposed in a matrix shape.

In the solid-state imaging device 20, the timing control circuit 24, the vertical scanning circuit 22, and the horizontal scanning circuit 23 are disposed as the control circuit for sequentially reading out a signal from the pixel unit 21. The timing control circuit generates internal clocks. The vertical scanning circuit 22 controls row addressing and row scanning. The horizontal transfer scanning circuit 23 controls column addressing and column scanning.

The ADC group 25 includes ADCs disposed at a plurality of columns, each of which includes a comparator 25-1, a counter 25-2, and a latch 25-3. The comparator 25-1 compares a reference voltage Vslop having a ramp waveform obtained by stepwise changing a reference voltage generated by DAC 26 with an analog signal obtained from a pixel at each row via a vertical signal line. The counter 25-2 counts a comparison time. The latch 25-3 holds a count result.

The ADC group 25 has an n-bit digital signal conversion function, each ADC being disposed at each vertical signal line (column line) to constitute a column parallel ADC block.

An output of each latch 25-3 is connected to a horizontal transfer line 29 having, for example, a 2n-bit width.

Amplifier circuits 27 the number of which is 2n corresponding to the horizontal transfer line 29, and a signal processing circuit 28 are disposed.

In the ADC group 25, an analog signal (potential Vsl) read out to the vertical signal line is compared with the reference voltage Vslop (a slope waveform having a gradient and changing linearly) at the comparator 25-1 disposed at each column.

In this case, the counter 25-2 disposed at each column similar to the comparator 25-1 is in operation and changes its count in one-to-one correspondence with the potential Vslop of the ramp waveform, to thereby convert a potential (analog signal) Vsl at a vertical signal line into a digital signal.

A change in the reference voltage Vslop is used for converting a voltage change into a time change, and the converted time is counted at a period (clock) to convert the time into a digital value.

When the analog electric signal Vsl and the reference voltage Vslop cross, the output of the comparator 25-1 is inverted to stop an input clock to the counter 25-2, and the AD conversion is then completed.

After the completion of the above-described AD conversion period, the horizontal transfer scanning circuit 23 operates to input data latched in the latches 25-3 to the signal processing circuit 28 via the horizontal transfer line 29 and the amplifier circuit 27 to generate a two-dimensional image.

In this manner, the column parallel output processing is performed.

SUMMARY OF THE INVENTION

As described above, in CMOS image sensor employing the column parallel ADC (column AD scheme CMOS image sensor), the comparator compares a ramp wave from DAC with a pixel signal and the counter at the succeeding stage performs digital CDS, thereby performing AD conversion.

Generally, a comparator has a two-stage amplifier configuration. A low speed signal comparison operation is performed at the first stage to narrow an operation band, and the amplifier at the second stage increases a gain.

With this circuit arrangement, however, through current continues to flow through the amplifier at the second stage after the cross between the ramp wave and a pixel signal. Accordingly, in the case of concurrent operations of columns and in other cases, an analog power supply fluctuation becomes large due to IR drops, and there is a possibility of malfunctions of adjacent comparator and a comparator itself in operation due to noises via the power supply.

Accordingly, it is desirable to provide a solid-state imaging device and a camera system capable of suppressing an analog power supply fluctuation and malfunctions.

In accordance with one aspect of the present invention, there is provided a solid-state imaging device including a pixel unit including a plurality of pixels in a matrix shape wherein each pixel is configured to perform photoelectric conversion, and a pixel signal readout circuit for reading out a pixel signal from the pixel unit in units of a plurality of pixels. The pixel signal readout circuit includes a plurality of comparators disposed to correspond to a column array of pixels, a plurality of counters whose operations are controlled by outputs of the comparators. Each of the comparators is configured to compare a read-out signal potential with a reference voltage to generate a determination signal and output the determination signal. Each of the counters is configured to count a comparison time of a corresponding one of the plurality of comparators. Each of the comparators includes a first amplifier, a second amplifier for outputting an output of the first amplifier with an increased gain, and a mirror circuit to form a current mirror in parallel with the second amplifier. The first amplifier includes differential transistors, initializing switches connected between gates and collectors of the differential transistors, and first and second capacitors connected to each of the gates of the differential transistors. The differential transistor perform a comparison operation between the reference voltage and the read-out signal potential by receiving the reference voltage at a gate of one transistor and receiving the read-out signal potential at a gate of the other transistor. The initializing switches determine an operating point for each column at a start of row operation. The first and second capacitors sample at a time of initialization. The second amplifier includes an initializing switch for determining an operating point for each column at a start of row operation and a third capacitor for sampling at a time of initialization. The mirror circuit includes a gate input transistor whose gate is inputted with a voltage sampled by the first amplifier or a voltage sampled by the second amplifier.

The second amplifier may include a first conductivity type gate input transistor whose gate is inputted with an output of the first amplifier, a second conductivity type transistor connected in series with the first conductivity type transistor and for forming a mirror circuit, the initializing switch being disposed between a gate and a drain thereof, and the gate thereof being connected to the third capacitor, and an output node being formed at a connection point between the first conductivity type transistor and the second conductivity type transistor. The mirror circuit may include a second conductivity type transistor connected in series with the gate input transistor, a gate thereof being connected to the third capacitor in common with the gate of the second conductivity type transistor. The gate of the gate input transistor may be connected to the output node of the second amplifier and the gate input transistor may be composed of a first conductivity type transistor.

The reference voltage may have a slope waveform having a gradient and changing linearly. The first amplifier may output to the second amplifier a comparison output having a level allowing the first conductivity type gate input transistor of the second amplifier to be turned on until the read signal and the slope waveform of the reference voltage cross, and to be turned off after the cross. In the mirror circuit, the gate input transistor may turn on until the read signal and the slope waveform of the reference voltage cross, and turn off after the cross.

The second amplifier may include: a first conductivity type gate input transistor whose gate is inputted with an output of the first amplifier, and a second conductivity type, connected in series with the first conductivity type transistor, for forming a mirror circuit, the initializing switch being disposed between a gate and a drain thereof, and the gate thereof being connected to the third capacitor. An output node may be formed at a connection point between the first conductivity type transistor and the second conductivity type transistor. The mirror circuit may include a second conductivity type transistor connected in series with the gate input transistor, a gate thereof being connected to the third capacitor in common with the gate of the second conductivity type transistor. The gate of the gate input transistor may be connected to the output node of the first amplifier, and the gate input transistor may be composed of a second conductivity type transistor having a conductivity type opposite to the first conductivity type gate input transistor of the second amplifier.

The mirror circuit may be controlled after a logical threshold value of the mirror circuit is adjusted.

In accordance with another aspect of the present invention, there is provided a camera system including a solid-state imaging device and an optical system for forming an image of object upon the solid-state imaging device. The solid-state imaging device includes a pixel unit including a plurality of pixels in a matrix shape wherein each pixel is configured to perform photoelectric conversion, and a pixel signal readout circuit for reading out a pixel signal from the pixel unit in units of a plurality of pixels. The pixel signal readout circuit includes a plurality of comparators disposed to correspond to a column array of pixels, a plurality of counters whose operations are controlled by outputs of the comparators. Each of the comparators is configured to compare a read-out signal potential with a reference voltage to generate a determination signal and output the determination signal. Each of the counters is configured to count a comparison time of a corresponding comparator of the comparators. Each of the comparators includes a first amplifier, a second amplifier for outputting an output of the first amplifier with an increased gain, and a mirror circuit to form a current mirror in parallel with the second amplifier. The first amplifier includes differential transistors, initializing switches connected between gates and collectors of the differential transistors, and first and second capacitors connected to each of the gates of the differential transistors. The differential transistor perform a comparison operation between the reference voltage and the read-out signal potential by receiving the reference voltage at a gate of one transistor and receiving the read-out signal potential at a gate of the other transistor. The initializing switches determine an operating point for each column at a start of row operation. The first and second capacitors sample at a time of initialization. The second amplifier includes an initializing switch for determining an operation point for each column at a start of row operation and a third capacitor for sampling at a time of initialization. The mirror circuit includes a gate input transistor whose gate is inputted with a voltage sampled by the first amplifier or a voltage sampled by the second amplifier.

According to embodiments of the present invention, the pixel signal readout circuit compares a read-out signal potential with a reference voltage to generate a determination signal, and outputs the determination signal. An operation of the counter is controlled by an output of the comparator, and the counter counts a comparison time of a corresponding comparator.

The reference voltage has a slope waveform having a gradient and changing linearly. The first amplifier outputs to the second amplifier a comparison output having a level allowing the first conductivity type gate input transistor of the second amplifier to be turned on until the read signal and the slope waveform of the reference voltage cross, and to be turned off after the cross.

In the mirror circuit, the gate input transistor turns on until the read-out signal and the slope waveform of the reference voltage cross, and turns off after the cross.

According to embodiments of the present invention, a fluctuation in an analog power supply can be suppressed so that malfunctions can be prevented.

The above summary of the present invention is not intended to describe each illustrated embodiment or every implementation of the present invention. The figures and the detailed description which follow more particularly exemplify these embodiments.

DETAILED DESCRIPTION OF EMBODIMENTS

Embodiments of the present invention will be described in connection with the accompanying drawings.

Figure 3:
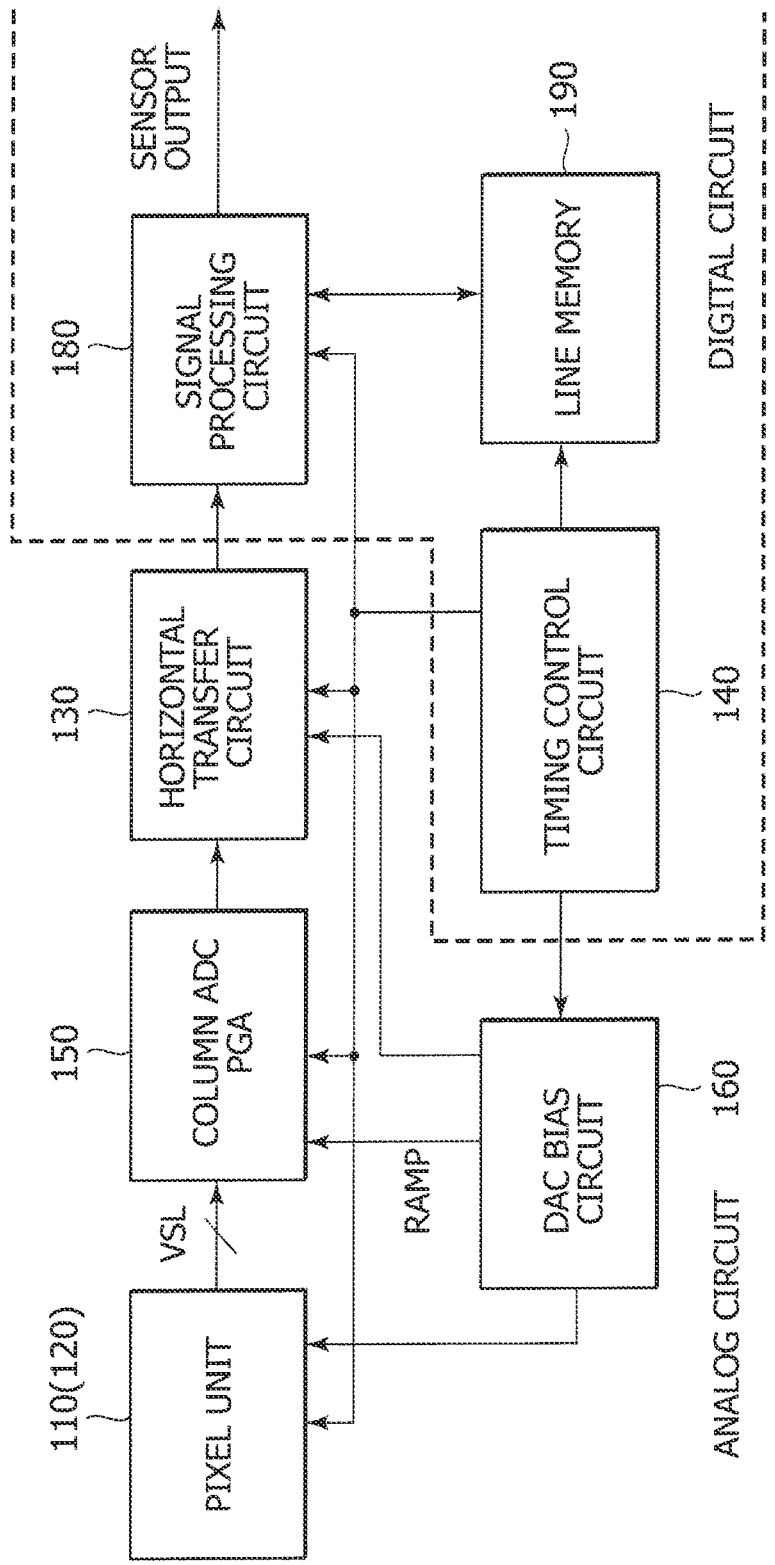
FIG. 3 is a block diagram showing a configuration of solid-state imaging device (CMOS image sensor) employing a column parallel ADC according to an embodiment of the present invention.

FIG. 3 is a block diagram showing a configuration example of a solid-state imaging device (CMOS image sensor) employing a column parallel ADC according to an embodiment of the present invention.

Figure 4:
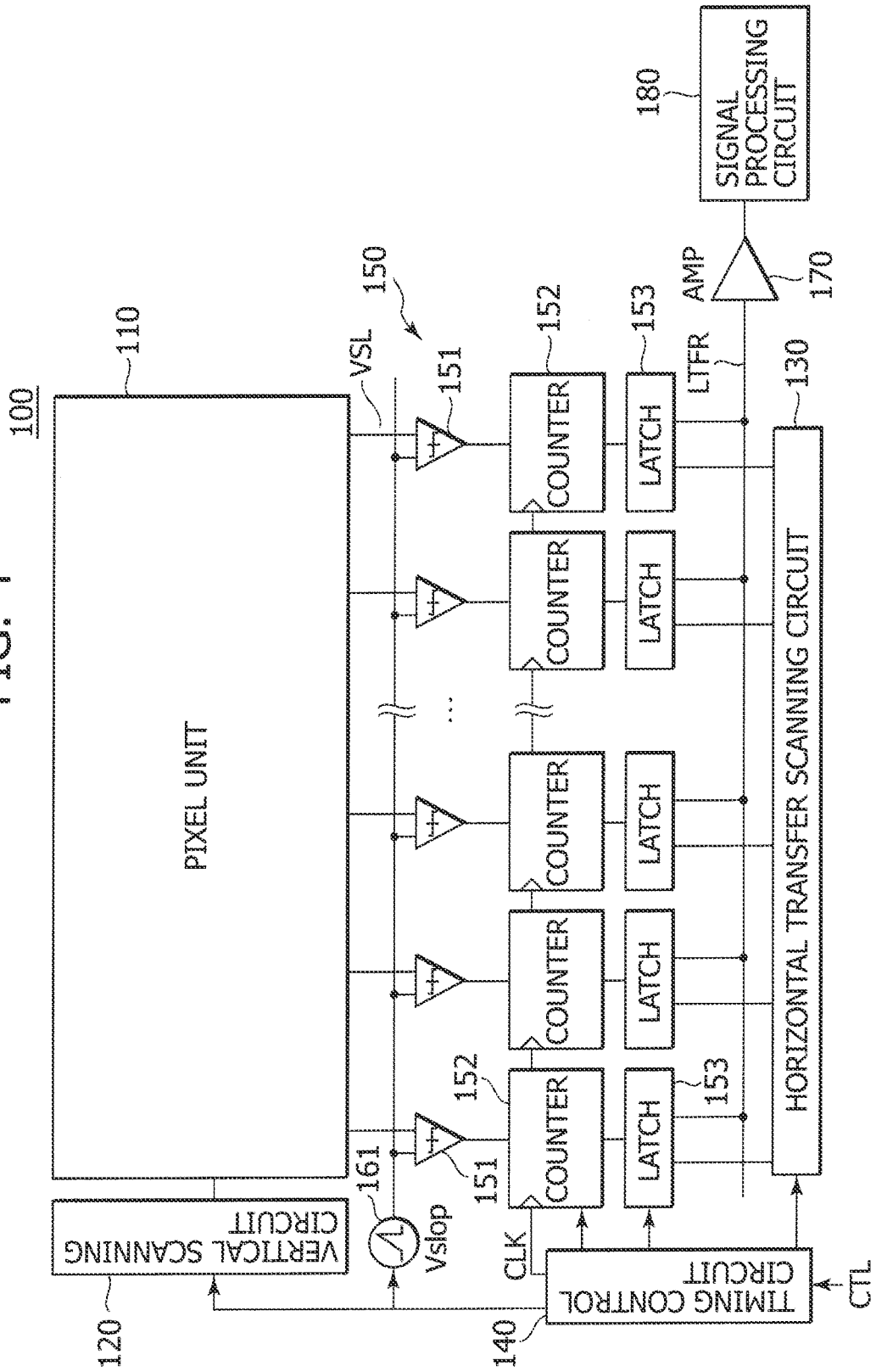
FIG. 4 is a block diagram showing more specifically an ADC group of the column parallel ADC employed by the solid-state imaging device (CMOS image sensor) shown in FIG. 3.

FIG. 4 is a block diagram showing more specifically an ADC group of the column parallel ADC employed by the solid-state imaging device (CMOS image sensor) shown in FIG. 3.

As shown in FIGS. 3 and 4, the solid-state imaging device 100 includes a pixel unit 110 as an imaging unit, a vertical scanning circuit 120, a horizontal transfer scanning circuit 130, a timing control circuit 140, an ADC group 150 as a pixel signal readout circuit, a DAC and bias circuit 160 including a DAC (digital-analog converter) 161, an amplifier circuit (S/A) 170, and a line memory 190.

Of these constituent components, the pixel unit 210, vertical scanning circuit 120, horizontal transfer scanning circuit 130, ADC group 150, DAC and bias circuit 160, and amplifier circuit (S/A) 170 are constituted by analog circuits.

The timing control circuit 140, signal processing circuit 180, and line memory 190 are constituted by digital circuits.

Figure 1:
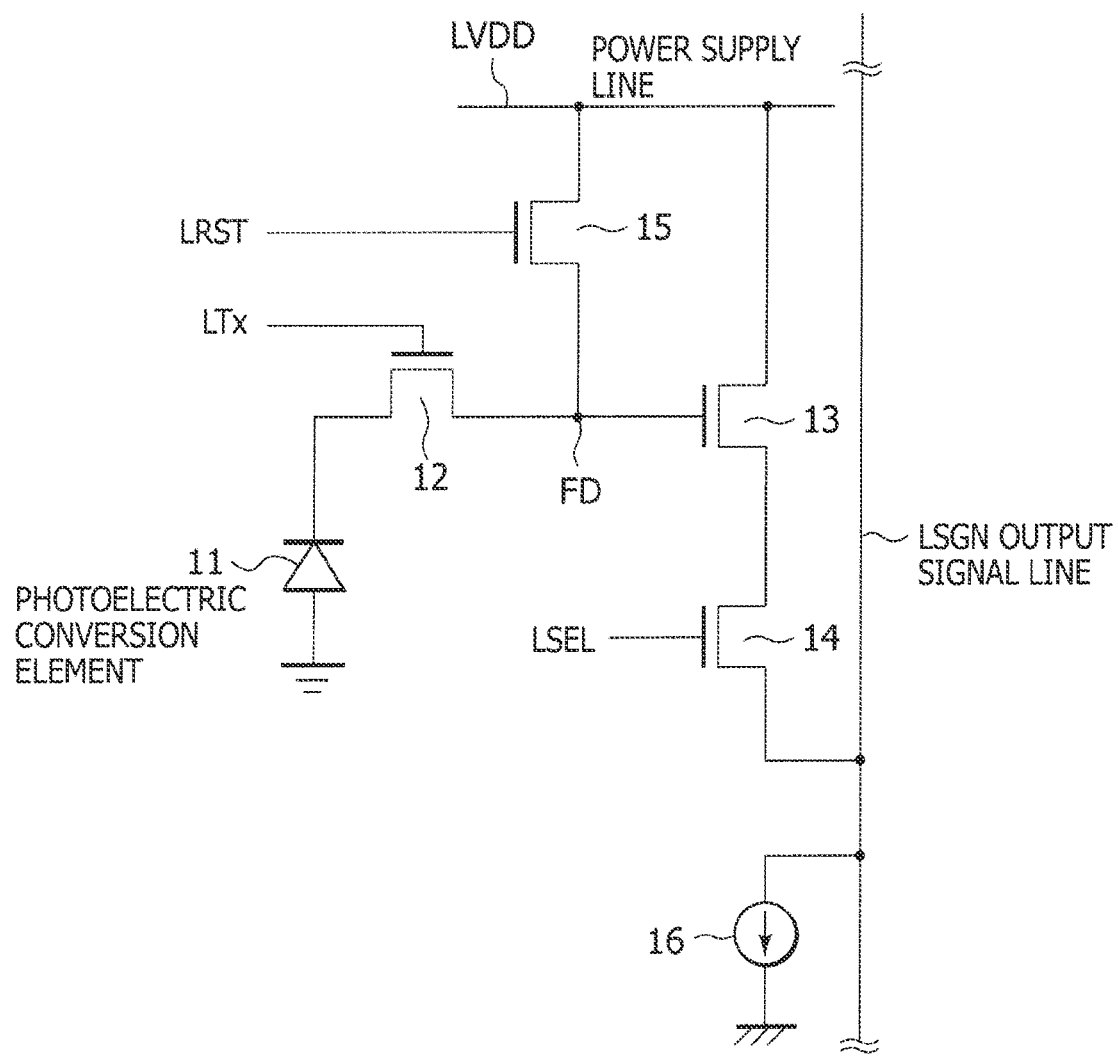
FIG. 1 is a diagram showing a configuration example of a pixel of a CMOS image sensor having four transistors.
Figure 2:
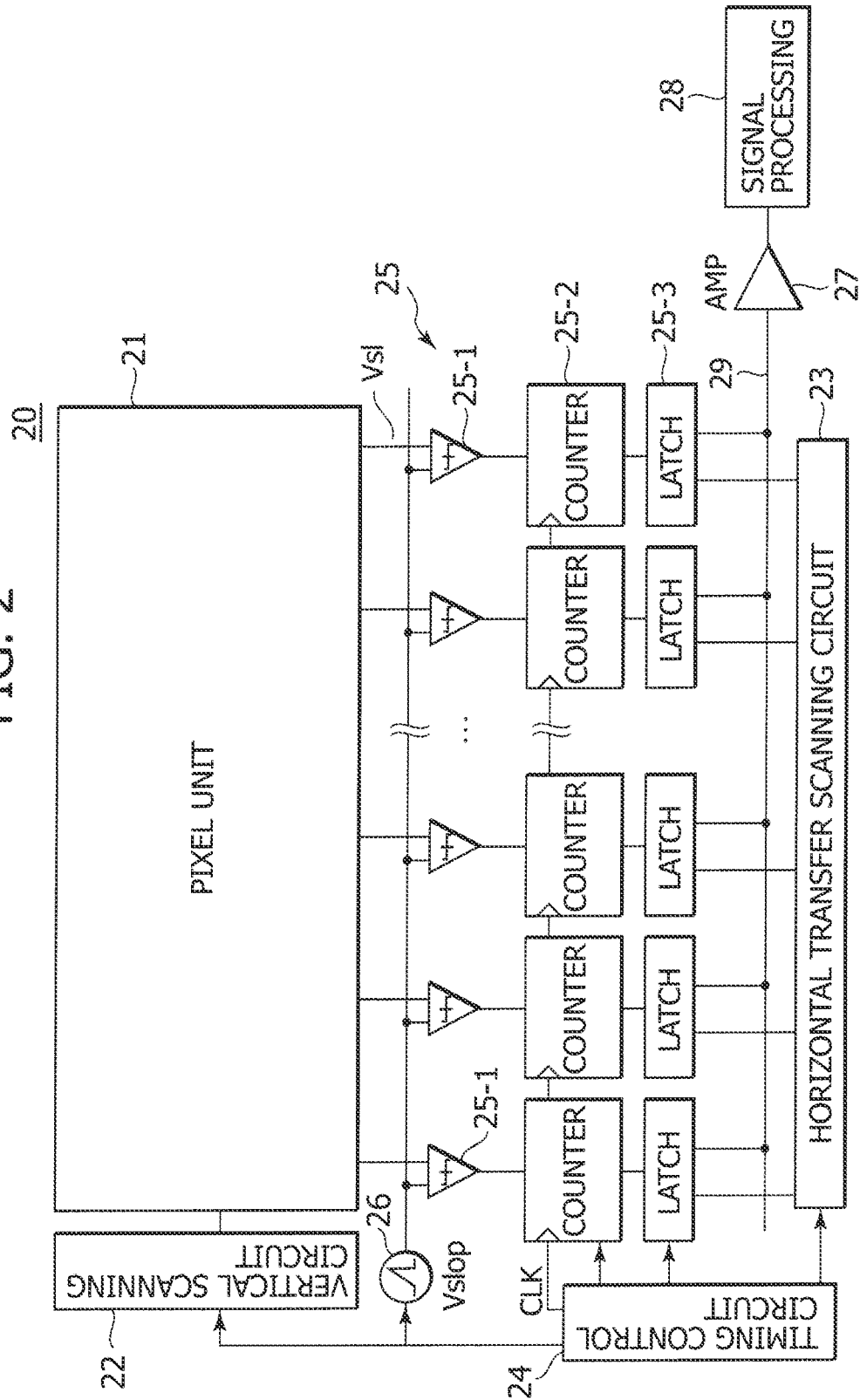
FIG. 2 is a block diagram showing an example of the configuration of solid-state imaging device (CMOS image sensor) employing a column parallel ADC.

The pixel unit 110 includes photodiodes and intra-pixel amplifiers, and is constituted of pixels such as shown in FIG. 1 disposed in a matrix shape.

In the solid-state imaging device 100, the timing control circuit 140, a vertical scanning circuit 120, and a horizontal transfer scanning circuit 130 are disposed as the control circuit for sequentially reading out a signal from the pixel unit 110. The timing control circuit generates internal clocks. The vertical scanning circuit 120 controls row addressing and row scanning. The horizontal transfer scanning circuit 130 controls column addressing and column scanning.

The timing control circuit 140 generates timing signals necessary for signal processing by the pixel unit 110, vertical scanning circuit 120, horizontal transfer scanning circuit 130, ADC group (column ADC circuit) 150, DAC and bias circuit 160, signal processing circuit 180, and line memory 190.

In the pixel unit 110, by utilizing photon accumulation and discharge using a line shutter, a moving image and a still image are photoelectrically converted in each pixel row, and an analog signal VSL is outputted to the ADC group.

In the ADC group 150, each ADC block (each column unit) performs for an analog output from the pixel unit 110, an APGA-compatible integrated type ADC compatible using a ramp signal RAMP supplied from a DAC 161 and digital CDS, to output a digital signal of several bits.

In the ADC group 150, a plurality of ADCs are arrayed in a column fashion. Each ADC includes: a comparator 151 for comparing a reference voltage Vslop having a ramp waveform (RAMP) obtained by stepwise changing a reference voltage generated by DAC 161 with an analog signal (potential VSL) obtained from a pixel at each row via a vertical signal line; a counter 152 for counting a comparison time; and a latch 153 for holding a count result.

The ADC group 150 has an n-bit digital signal conversion function. Each ADC is disposed at each vertical signal line (column line) to constitute a column parallel ADC block.

An output of each latch 153 is connected to a horizontal transfer line having, for example, a 2n-bit width.

The amplifier circuits 170 the number of which is 2n corresponding to the horizontal transfer line LTRF and a signal processing circuit 180 are disposed.

Specific configuration and function of the comparator 151 will be described later in detail.

In the ADC group 150, an analog signal (potential VSL) read out to the vertical signal line is compared with the reference voltage Vslop (RAMP signal of a slope waveform having a gradient and changing linearly) at the comparator 151 disposed at each column.

In this case, the counter 152 disposed at each column similar to the comparator 151 is in operation and changes its count in one-to-one correspondence with the ramp signal RAMP (potential Vslop), to thereby converts a potential (analog signal) VSL at a vertical signal line into a digital signal.

A change in the reference voltage Vslop (ramp signal RAMP) is used for converting a voltage change into a time change, and the converted time is counted at a certain period (clock) to convert the time into a digital value.

When the analog signal VSL crosses the ramp signal RAMP (reference voltage Vslop), an output of the comparator 151 is inverted to stop an input clock to the counter 152 and complete AD conversion.

After completion of the above-described AD conversion period, the horizontal transfer scanning circuit 130 operates to transfer data latched in the latches 153 to a horizontal transfer line LTRF and input the data to the signal processing circuit 180 via the amplifier circuit 170 to generate a two-dimensional image by predetermined signal processing.

The horizontal transfer scanning circuit 130 performs concurrent parallel transfer of several channels in order to ensure a transfer rate.

The timing control circuit 140 generates timings necessary for signal processing by respective blocks such as the pixel unit 110, ADC group 150 and the like.

The signal processing circuit 180 at the succeeding stage performs digital signal processing for the signal stored in the line memory 190. This digital signal processing includes correction of vertical line defects and point defects, signal clamping, parallel-serial conversion, compression, encoding, addition, averaging, intermittent operation and the like.

The line memory 190 stores digital signals transmitted from pixel on a row-by-row basis.

In the solid-state imaging device 100 of the embodiment, a digital output of the signal processing circuit 180 is transmitted as an input to an ISP and a BASEBAND LSI.

The ADC group (pixel signal readout circuit) 150 of the embodiment can suppress an analog power supply fluctuation to be caused by IR drops occurring during concurrent parallel processing and the like. The comparator 151 is configured as in the following so as to prevent malfunctions of adjacent comparators and a comparator itself in operation to be cause by noises via the power supply.

In an example of the first configuration, each comparator 151 disposed at each column includes first and second amplifiers connected in cascade, and a mirror circuit is disposed in parallel with the second amplifier of the comparator 151. The mirror circuit is supplied as its gate input a voltage obtained through initialization (auto zero: AZ) and sampling at a start of row operation to determine an operating point at each column.

In the example of the first configuration, an output level of the second amplifier is detected to control the mirror circuit, thereby suppressing a change in an analog power supply.

The first amplifier is configured to perform a low speed signal comparison operation at the first stage to narrow an operation band, and the second amplifier at the second stage is configured to increase the gain.

For AZ, the mirror circuit turns off after the cross between the RAMP waveform of the P- and D-phases and a pixel signal, and turns on before the cross between the RAMP waveform of the P/D phase and a pixel signal. Therefore, a steady current of the comparator is constant not depending upon bright/dark.

In an example of the second configuration, as in the case of first configuration, each comparator 151 includes first and second amplifiers connected in cascade, and a mirror circuit is disposed in parallel with the second amplifier of the comparator 151. The mirror circuit is supplied as its gate input a voltage obtained through initialization (auto zero: AZ) and sampling at a start of row operation to determine an operating point at each column.

In the example of the second configuration, an output of the first amplifier is used as the gate input of mirror circuit connected in parallel to adjust a logical threshold value of the mirror circuit and control the mirror circuit to thereby suppress an analog power supply change.

Detailed description will now be made on the configuration and function of each comparator of the ADC group (pixel signal readout circuit) 150 having the characteristic configuration according to the embodiment.

In the embodiment, a first conductivity type is a p- or n-channel, and a second conductivity type is an n- or p-type. The comparator described hereunder is affixed a reference number "200".

Figure 5:
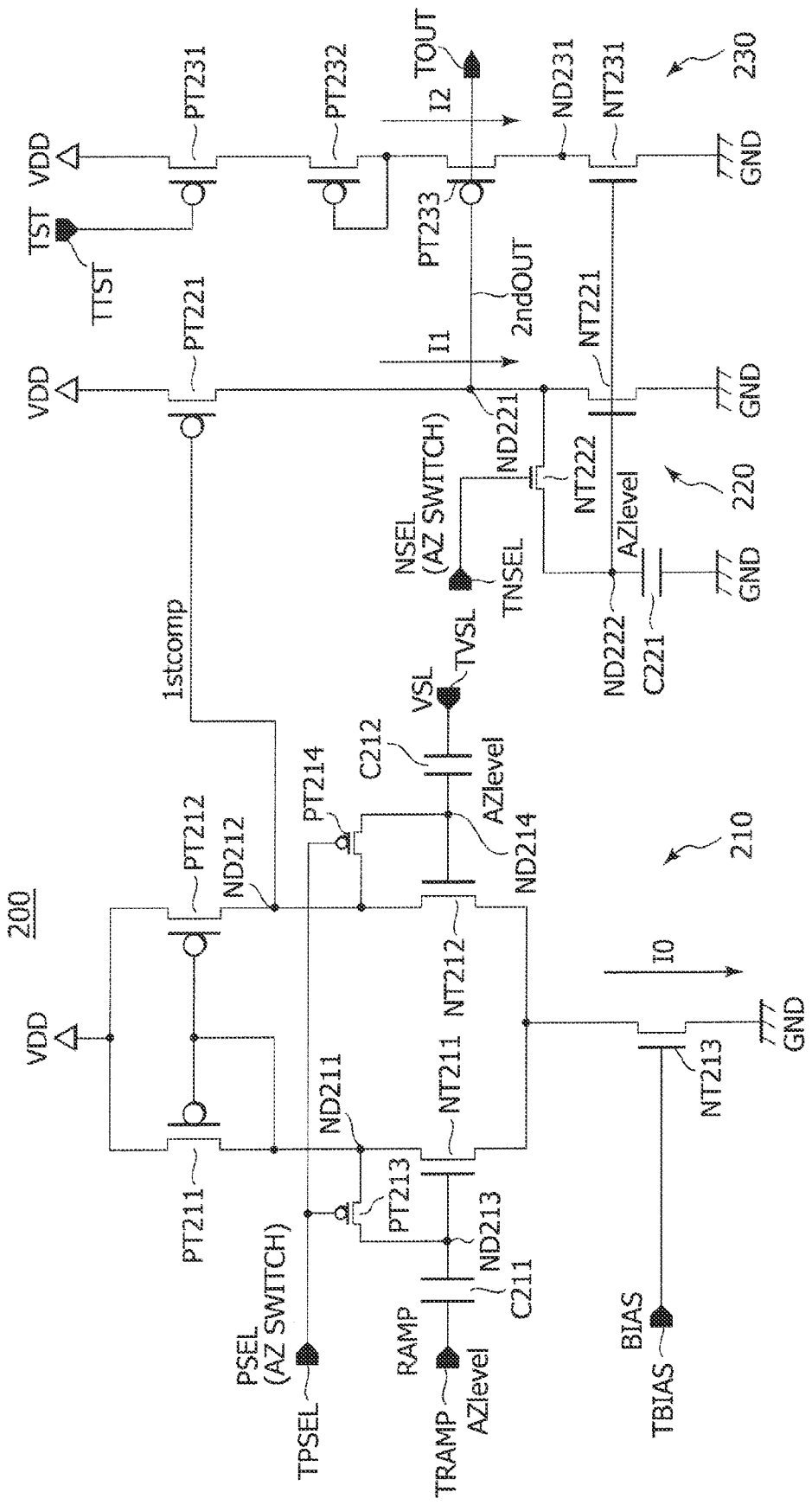
FIG. 5 is a circuit diagram showing a first configuration example of a comparator according to the embodiment.

FIG. 5 is a circuit diagram of the comparator having an example of the first configuration according to the embodiment.

As shown in FIG. 5, a comparator 200 includes a first amplifier 210 and a second amplifier 220 connected in cascade, and a mirror circuit 230 connected in parallel with the second amplifier 220. The mirror circuit is supplied as its gate input a voltage obtained through AZ (initialization) and sampling at a start of row operation to determine an operating point at each column.

The comparator 200 detects an output level of the second amplifier 220 to control the mirror circuit 230, thereby suppressing an analog power supply change.

Namely, for AZ, the mirror circuit 230 turns off after the cross between the RAMP waveform of the P- and D-phases and a pixel signal, and turns on before the cross between the RAMP waveform of the P/D phase and a pixel signal. Therefore, a steady current of the comparator is constant not depending upon bright/dark.

The first amplifier 210 includes p-channel MOS (PMOS) transistors PT211 to PT214, n-channel MOS (NMOS) transistors NT211 to NT213, and a first capacitor C211 and a second capacitor C212 as sampling capacitors for an AZ level.

The sources of the PMOS transistors PT211 and PT212 are connected to a power supply potential VDD. The drain of the PMOS transistor PT211 is connected to the drain of the NMOS transistor NT211, and a connection point therebetween constitutes a node ND211.

The drain and gate of the PMOS transistor PT211 are connected, and a connection point therebetween is connected to the gate of the PMOS transistor PT212.

The drain of the PMOS transistor PT212 is connected to the drain of the NMOS transistor NT212, and a connection point therebetween constitutes an output node of the first amplifier 210.

The sources of the NMOS transistors NT211 and NT212 are connected to each other, and a connection point therebetween is connected to the drain of the NMOS transistor NT213. The source of the NMOS transistor NT213 is connected to a ground potential GND.

The gate of the NMOS transistor NT211 is connected to a first electrode of the capacitor C211, and a connection point therebetween constitutes a node ND213. A second electrode of the capacitor C211 is connected to an input terminal TRAMP for a ramp signal RAMP.

The gate of the NMOS transistor NT212 is connected to a first electrode of the capacitor C212, and a connection point therebetween constitutes a node ND214. A second electrode of the capacitor C212 is connected to an input terminal TVSL for an analog signal VSL.

The gate of the NMOS transistor NT213 is connected to an input terminal TBIAS for a bias signal BIAS. The drain of the PMOS transistor PT213 is connected to the node ND211, and the source thereof is connected to the node ND213. The drain of the PMOS transistor PT214 is connected to the node ND213, and the source thereof is connected to the node ND214.

The gates of the PMOS transistors PT213 and PT214 are connected in common to an input terminal TPSEL for a first AZ signal PSEL which is active at a low level.

In the first amplifier 210 having the above-described configuration, the PMOS transistors PT211 and PT212 constitute a current mirror circuit, and the NMOS transistors NT211 and NT212 constitute a differential comparator unit using the NMOS transistor NT 213 as a current source.

The PMOS transistors PT213 and PT214 function as AZ switches, and the capacitors C211 and C212 function as sampling capacitors having an AZ level.

An output signal 1stcomp from the first amplifier 210 is outputted from the output node ND212 to the second amplifier 220.

The second amplifier 220 includes a PMOS transistor PT221, NMOS transistor NT221 and NT222, and a third capacitor C221 as a sampling capacitor having an AZ level.

The source of the PMOS transistor PT221 is connected to the power supply potential VDD, and the gate thereof is connected to the output node ND212 of the first amplifier 210.

The drain of the PMOS transistor PT221 is connected to the drain of the NMOS transistor NT221, and a connection point therebetween constitutes an output node ND 221.

The source of the NMOS transistor NT221 is connected to the ground potential GND, the gate thereof is connected to a first electrode of the capacitor C221, and a connection point therebetween constitutes a node ND222. A second electrode of the capacitor C221 is connected to the ground potential GND.

The drain of the NMOS transistor NT222 is connected to the node ND221, and the source thereof is connected to the node ND222.

The gate of the NMOS transistor NT222 is connected to an input terminal TNSEL for a second AZ signal NSEL which is active at the high level.

The second AZ signal NSEL takes a complementary level relative to the first AZ signal PSEL to be supplied to the first amplifier 210.

In the second amplifier 220 having the above-described configuration, the PMOS transistor PT221 constitutes an input and current source circuit.

The NMOS transistor NT222 functions as an AZ switch, and the capacitor C221 functions as a sampling capacitor having an AZ level.

The output node ND221 of the second amplifier 220 is connected to the gate of the PMOS transistor of the mirror circuit 230 and to an output terminal TOUT of the comparator 200.

The mirror circuit 230 includes PMOS transistors PT231 to PT233 and an NMOS transistor NT231.

The source of the PMOS transistor PT231 is connected to the power supply potential VDD, the gate thereof is connected to an input terminal TTST for a bias signal TST, and the drain thereof is connected to the source of the PMOS transistor PT232.

The drain of the PMOS transistor PT232 is connected to its own gate and to the source of the PMOS transistor PT233.

The drain of the PMOS transistor PT233 is connected to the drain of the NMOS transistor NT231, and a connection point therebetween constitutes a node ND231. The source of the NMOS transistor NT231 is connected to the ground potential GND.

The gate of the PMOS transistor PT233 is connected to the output node ND221 of the second amplifier 220, and the gates of the NMOS transistor NT231 and the NMOS transistor NT221 of the second amplifier 220 are connected in common to the node ND222.

In the second amplifier 220 having the above-described configuration, the PMOS transistors PT231 and PT232 and the NMOS transistor NT231 constitute a current source. The PMOS transistor PT233 constitutes a detector unit for an output level of the second amplifier 220.

Figure 6:
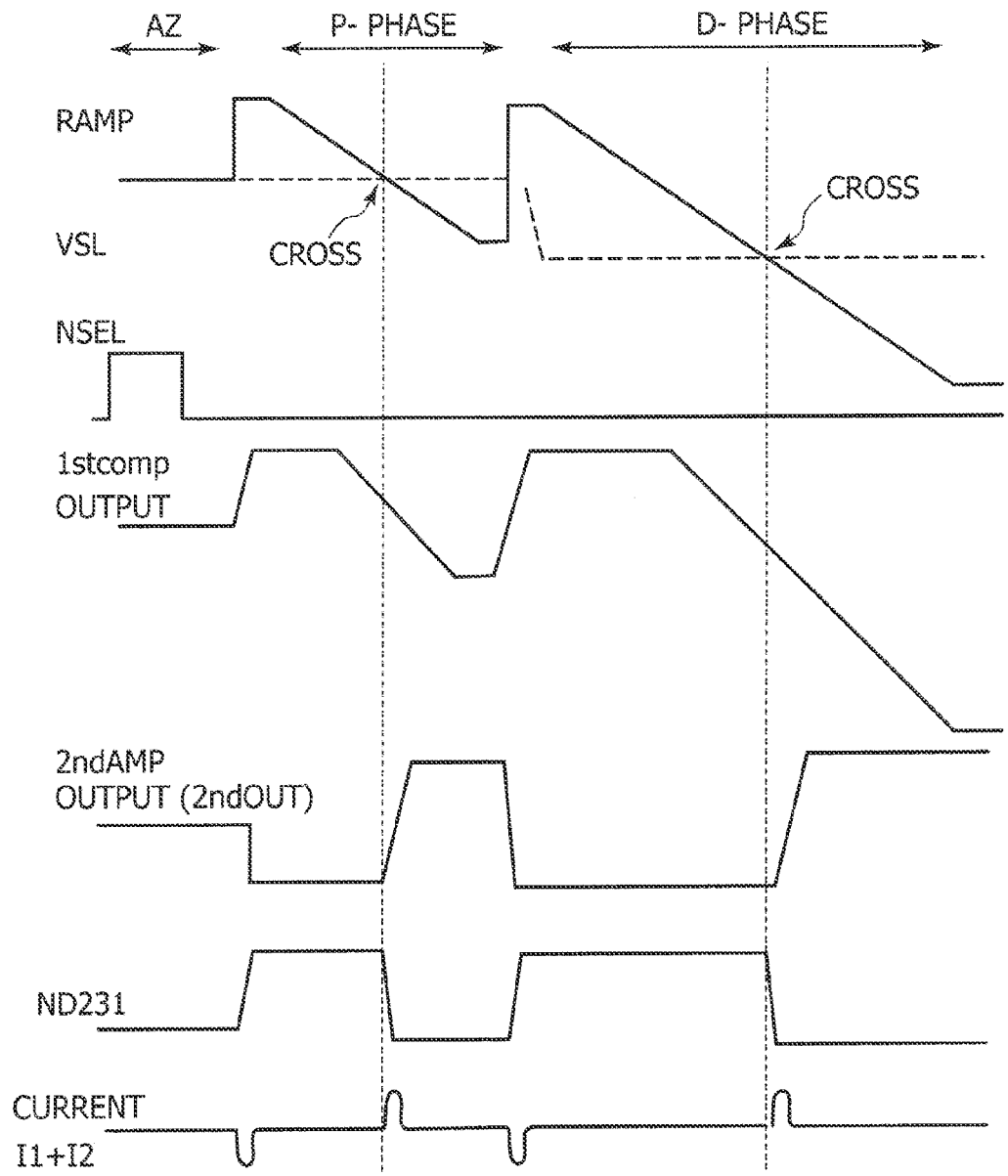
FIG. 6 is a timing chart of the comparator shown in FIG. 5.

Next, description will be made on the operation of the comparator 200 of the embodiment with reference to the timing chart of FIG. 6. In FIG. 6, as the AZ signal only the second AZ signal NSEL to be supplied to the second amplifier 220 is shown. As described above, the first AZ signal PSEL takes a complementary level relative to the second AZ signal NSEL. Namely, while the second AZ signal NSEL takes a high level, the first AZ signal PSEL takes a low level, whereas while the second AZ signal NSEL takes a low level, the first AZ signal PSEL takes a high level.

In the comparator 200, during an AZ period, the first AZ signal PSEL is supplied at a low level, and the second AZ signal NSEL is supplied at a high level. Accordingly, the PMOS transistors PT213 and PT214 as the AZ switches of the first amplifier 210 turn on. Similarly, the NMOS transistor NT222 as the AZ switch of the second amplifier 220 turns on.

Thus, in the ADC group 150, by using the comparator 200 (151) of the ADC group 150, a DC offset level, a pixel reset level, and an AZ level at each column are sampled to accumulate charges in the capacitors C211, 5212, and C221 of the AZ level sampling capacitors.

Next, when the AZ period is terminated, the first AZ signal PSEL is switched to a high level and the second AZ signal NSEL is switched to a low level. Accordingly, the PMOS transistors PT213 and PT214 as the AZ switches of the first amplifier 210 turn off. Similarly, the NMOS transistor NT222 as the AZ switch of the second amplifier 220 turns off.

Thus, integration type AD conversion (hereinafter called P-phase) at a pixel reset level starts.

In this case, since charges have been accumulated in the capacitor C221 of the second amplifier, a potential of the node ND222 takes a level capable of conducting the NMOS transistor. As a result, the NMOS transistor NT221 of the second amplifier 220 and the NMOS transistor NT231 of the mirror circuit 230 are maintained in an on-state.

In the first amplifier 210 of the comparator 200, the nodes ND213 and ND214 of the capacitors C211 and C212 as the sampling capacitors accumulated charges during the AZ period, on the gate side of the NMOS transistors NT211 and NT212, are in a high impedance (HiZ) state.

Therefore, the gate inputs of the NMOS transistors NT211 and NT212 constituting differential transistors change with a ramp waveform change in the ramp signal RAMP by DAC 161, and comparison between the ramp signal and the pixel signal VSL level starts.

After the ramp signal RAMP crosses the pixel signal, the output signal 1stcomp of the first amplifier 210 changes abruptly.

Therefore, the PMOS transistor PT221 of the second amplifier 220 turns on, a current I1 starts flowing, and an output 2ndOUT of the second amplifier changes from the low level (L) to the high level (H).

As the output 2ndOUT of the second amplifier 220 changes from the low level (L) to the high level (H), the PMOS transistor PT233 of the mirror circuit 230 turns off and the level at the node ND231 changes from the high level (H) to the low level (L), so that a through current I2 of the mirror circuit 230 turns off (will not flow).

Before the ramp signal RAMP and pixel signal cross, although the PMOS transistor Pt221 of the second amplifier 220 turns off opposite to the above case and the through current I1 turns off. However, the output 2ndOUT of the second amplifier 220 is fixed to the low level (L).

Consequently, the PMOS transistor PT233 of the mirror circuit 230 turns on. As a result, the node ND231 takes an intermediate level, and a through current I2 flows (P-phase period in the timing chart of FIG. 6).

In this case, the NMOS transistor NT221 of the second amplifier 220 and the NMOS transitory NT231 of the mirror circuit 230 form a just mirror circuit, and the values of the through currents I1 and I2 are the same in the saturation operation.

Therefore, the sum of the through current I1+I2 is constant before and after the cross of the ramp signal RAMP and pixel signal.

Since the comparator 200 at each column performs the same operation as the P-phase, also in the D-phase, kTC noises and pixel reset noises can be cancelled out through analog CDS (D-phase period in the timing chart of FIG. 6).

Glitch is generated corresponding to a switching delay difference between the PMOS transistor PT221 of the second amplifier 210 and the PMOS transistor PT233 of the mirror circuit 230. However, since frequency components are high, the glitch will not result in malfunctions of the comparator itself in operation and adjacent comparators.

An analog power supply fluctuation caused by glitch may AC-couple the RAMP waveform and the nodes ND213, ND214, and ND222, of the comparator 200 at high impedance (HiZ). However, coupling to the RAMP waveform is associated with swing-return, so that convergence of the ramp waveform becomes fast and a light amount dependency characteristics of streaking is expected to be improved, although improvement on a peak value of streaking is indefinite.

Further, offset components of a signal caused by coupling to the nodes ND213, ND214, and ND222, with high impedance (HiZ) can be cancelled out because of a return of an analog power supply waveform.

Figure 7:
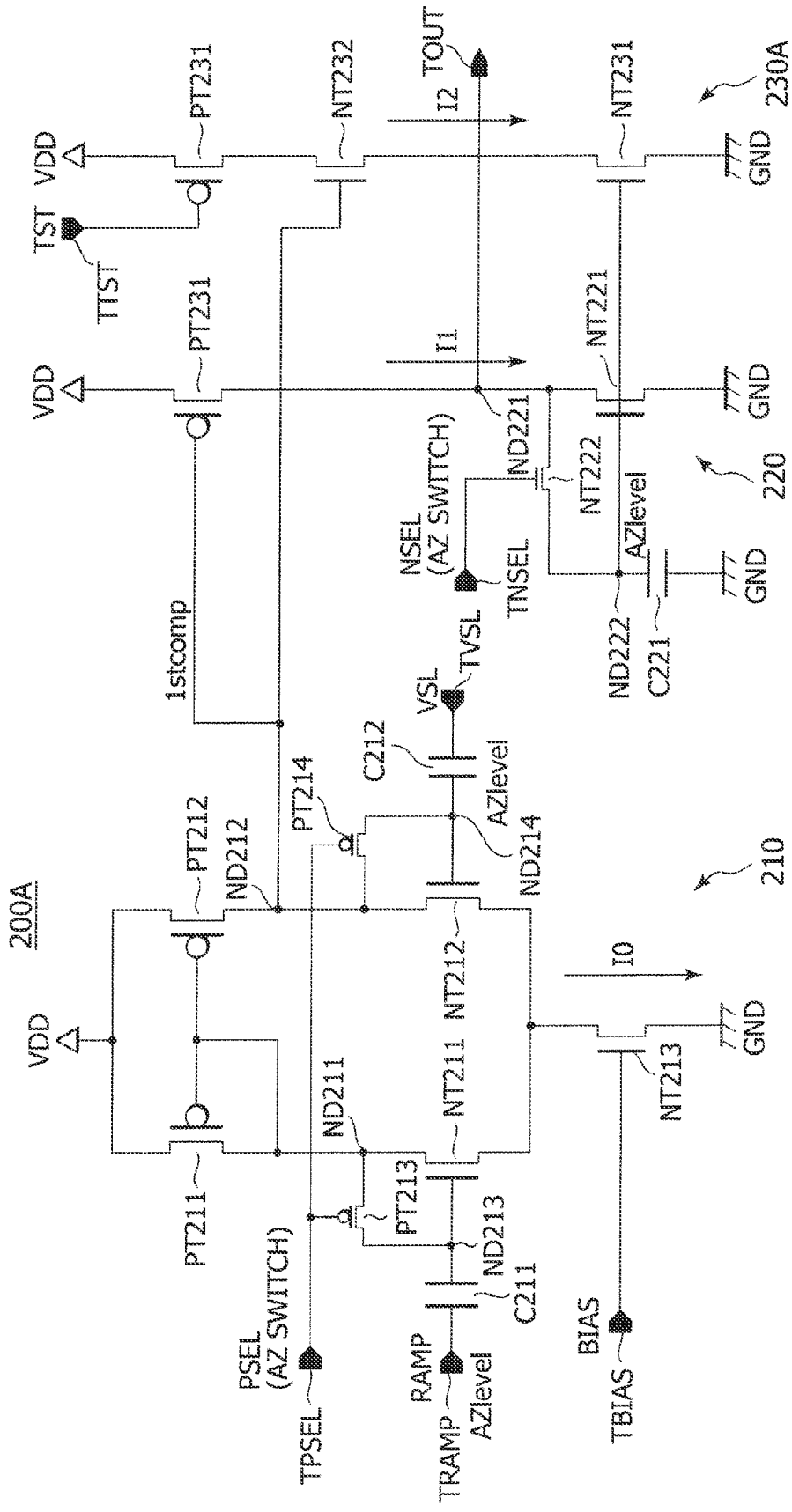
FIG. 7 is a circuit diagram showing an example of a second configuration of the comparator according to the embodiment.

FIG. 7 is a circuit diagram showing an example of the second configuration of the comparator according to the embodiment.

Different points of a comparator 200A of the example of the second configuration from the comparator 200 of the example of the first configuration described above reside in that the diode-connected PMOS transistor PT232 is removed, a NMOS transistor NT232 is used in place of the PMOS transistor PT233 as a gate input transistor, and the gate of the NMOS transistor NT232 is connected not to the output node DN221 of the second amplifier 220 but to the output node ND212 of the first amplifier 210.

According to the comparator 200A shown in FIG. 7, a change in the analog power supply, particularly a change in the second amplifier 220 can be removed.

A switching delay difference between the PMOS transistor PT221 of the second amplifier 220 and the NMOS transistor NT232 of the mirror circuit 230A becomes smaller than that of the comparator 200 shown in FIG. 5, so that the change in an analog power supply can be made smaller than that of the comparator shown in FIG. 5.

A logical threshold value of a circuit parallel to the second amplifier is required to set to the same value as that of the second amplifier 220. A circuit threshold value may be set by adjusting a channel length L of a MOS transistor or other methods.

Other configurations are similar to those of the example of the first configuration.

Also in the example of the second configuration, after the ramp signal RAMP crosses the pixel signal, the output signal 1stcomp of the first amplifier 210 changes abruptly.

Consequently, the PMOS transistor PT221 of the second amplifier 220 turns on, a current I1 starts flowing, and an output 2ndOUT of the second amplifier changes from the low level (L) to the high level (H).

After the cross between the ramp signal RAMP and pixel signal, the NMOS transistor NT 232 of the mirror circuit 230A turns off almost complementary relative to the PMOS transistor PT221 of the second amplifier 220 in the on-state, and the level at the node ND231 changes from the high level (H) to the low level (L), so that a through current I2 of the mirror circuit 230A turns off (will not flow).

Before the ramp signal RAMP and pixel signal cross, the PMOS transistor PT221 of the second amplifier 220 turns off opposite to the above case and the through current I1 turns off, and the output 2ndOUT of the second amplifier 220 is fixed to the low level (L).

In this case, in the mirror circuit 230A, the NMOS transistor NT232 turns off almost complementary relative to the PMOS transistor PT221 of the second amplifier in the off-state. As a result, the node ND231 takes an intermediate level, and a through current I2 flows.

In this case, the NMOS transistor NT221 of the second amplifier 220 and the NMOS transistor NT231 of the mirror circuit 230A form a just mirror circuit, and the values of the through currents I1 and I2 are the same in the saturation operation.

Accordingly, the sum of the through current I1+I2 is constant before and after the cross of the ramp signal RAMP and pixel signal.

Since the comparator 200 at each column performs the same operation as the P-phase, also in the D-phase, kTC noises and pixel reset noises can be cancelled out through analog CDS.

A probability of generating glitch is lowered because a switching delay difference between the PMOS transistor PT221 of the second amplifier 210 and the NMOS transistor NT232 of the mirror circuit 230A is smaller than that of the comparator shown in FIG. 5. Even if glitch is generated, since frequency components are high, the glitch will not result in malfunctions of the comparator itself in operation and adjacent comparators, as described earlier.

An analog power supply fluctuation caused by glitch may AC-couple the RAMP waveform and the nodes ND213, ND214, and ND222, of the comparator 200 with high impedance (HiZ). However, coupling to the RAMP waveform is associated with swing-return, so that convergence of the ramp waveform becomes fast and a light amount dependency characteristics of streaking is expected to be improved, although improvement on a peak value of streaking is indefinite.

Furthermore, offset components of a signal caused by coupling to the nodes ND213, ND214, and ND222, with high impedance (HiZ) can be cancelled out because of a return of an analog power supply waveform.

Figure 8:
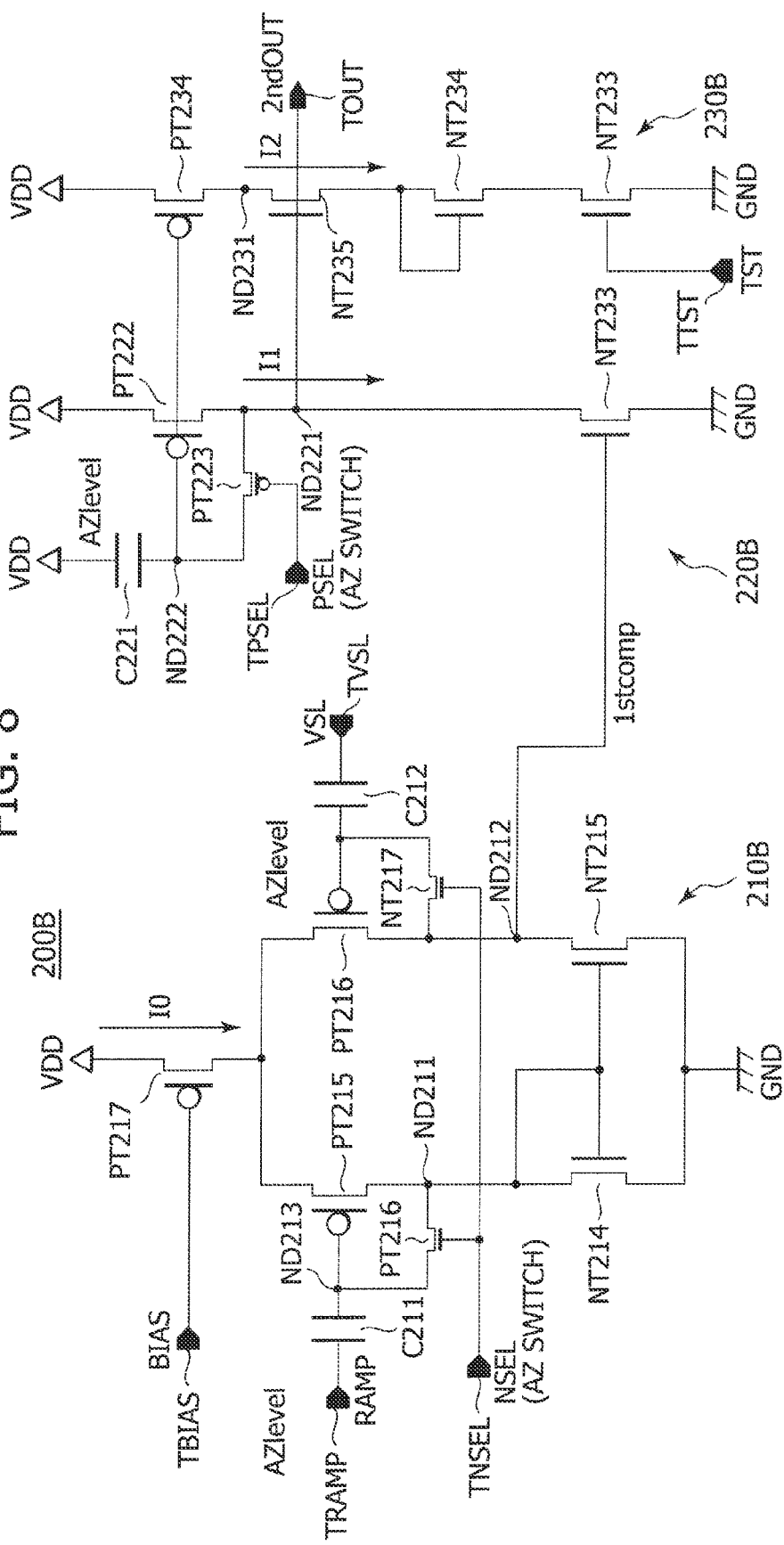
FIG. 8 is a circuit diagram showing an example of the first configuration of the comparator according to a modification of the embodiment.

FIG. 8 is a circuit diagram of a modification of the example of the first configuration of the comparator according to the embodiment.

A comparator 200B shown in FIG. 8 is configured by inverting the polarities of the transistors of the comparator 200 shown in FIG. 5. The power supply potential and ground potential are therefore reversed in the circuit diagram.

In order to make it easy to understand, in FIG. 8, reference symbols of nodes and capacitors are represented by identical reference symbols to those of FIG. 5.

In a first amplifier 210B, instead of the NMOS transistors NT211 to NT213 shown in FIG. 5, PMOS transistors PT215 to PT217 are used to constitute a differential comparator unit and a current source. The source of the PMOS transistor PT217 as a current source is connected to the power supply potential VDD.

Instead of the PMOS transistors PT211 and PT212 shown in FIG. 5, NMOS transistors NT214 and NT215 are used to constitute a current mirror circuit, and the sources of the NMOS transistors NT214 and NT215 are connected to the ground potential GND.

Instead of the PMOS transistors PT213 and PT212 shown in FIG. 5, NMOS transistors NT216 and NT217 are used to constitute AZ switches. In this case, in the first amplifier 210B, a second AZ signal NSEL is supplied to the gates of the NMOS transistors NT216 and NT217.

In a second amplifier 220B, instead of the PMOS transistor PT221 shown in FIG. 5, an NMOS transistor NT223 is used to constitute an input and current source circuit. The source of the NMOS transistor NT223 is connected to the ground potential GND.

Instead of the NMOS transistor NT221 shown in FIG. 5, a PMOS transistor PT222 is used to constitute a mirror circuit. The source of the PMOS transistor PT222 is connected to the power supply potential VDD. A first electrode of a capacitor C221 is connected to a node ND222 connected to the gate of the PMOS transistor PT222, and a second electrode thereof is connected to the power supply potential VDD.

Instead of the NMOS transistor NT222 shown in FIG. 5, a PMOS transistor PT223 is used to constitute an AZ switch. In this case, in the second amplifier 220B, a first AZ signal PSEL is supplied to the gate of the PMOS transistor PT223.

In the mirror circuit 230B, instead of the PMOS transistors PT231 to PT233 shown in FIG. 5, NMOS transistors NT233 to NT235 are used to constitute a current source and a gate input transistor. The source of the NMOS transistor NT233 is connected to the ground potential GND.

Instead of the NMOS transistor NT231 shown in FIG. 5, a PMOS transistor PT234 is used to constitute a mirror circuit. The source of the PMOS transistor PT234 is connected to the power supply potential VDD.

The comparator 200B shown in FIG. 8 having the configuration described above operates basically in a manner similar to that of the comparator 200 shown in FIG. 5, and the timing chart of FIG. 6 is applicable without any change.

According to the comparator 200B shown in FIG. 8, similar effects to those of the comparator 200 shown in FIG. 5 can be obtained.

Figure 9:
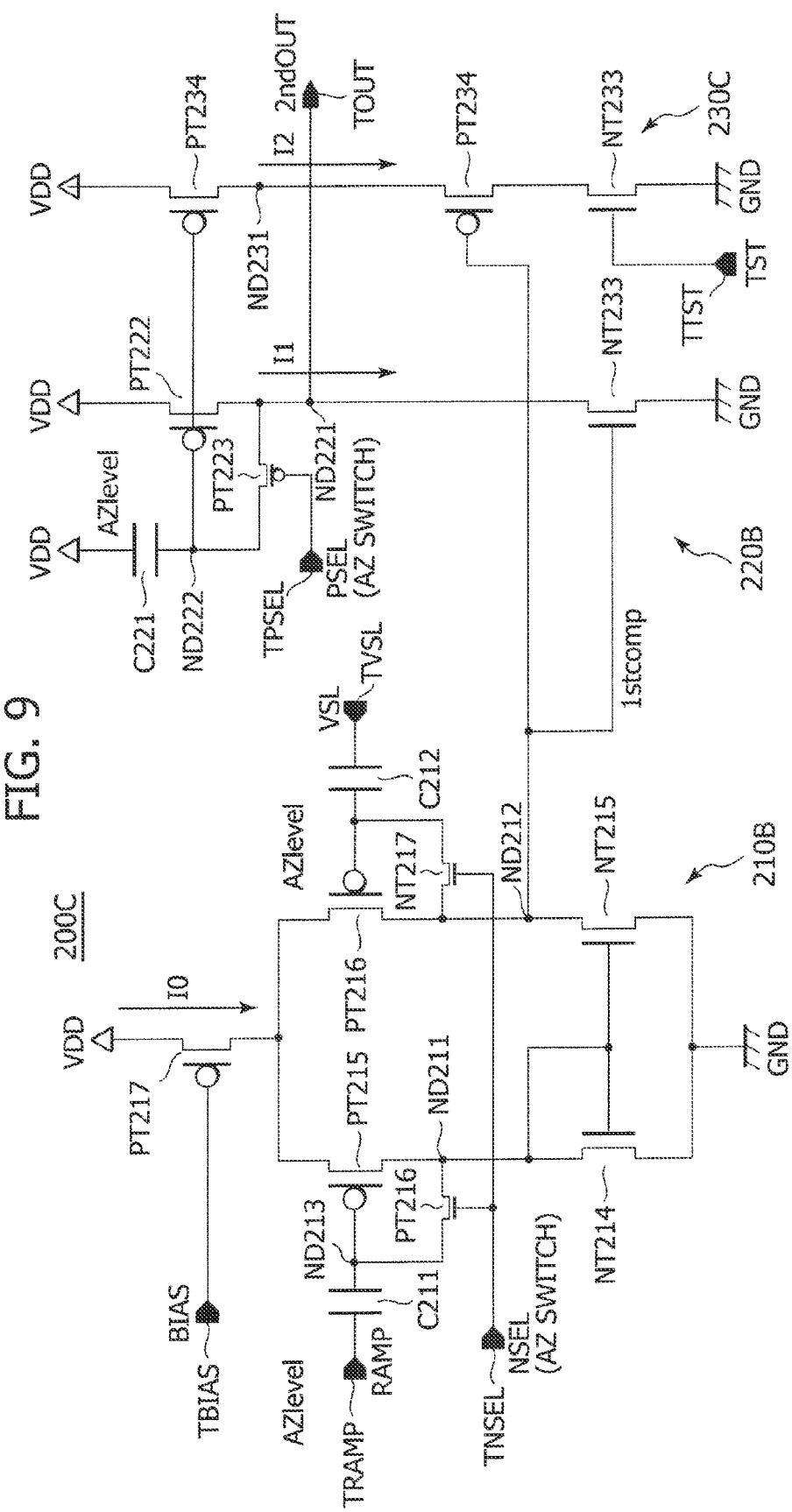
FIG. 9 is a circuit diagram showing an example of the second configuration of the comparator according to a modification of the embodiment.

FIG. 9 is a circuit diagram of a modification of the example of the second configuration of the comparator according to the embodiment.

A comparator 200C shown in FIG. 9 is configured by inverting the polarities of the transistors of the comparator 200 shown in FIG. 5. The power supply potential and ground potential are therefore reversed in the circuit diagram.

In order to make it easy to understand, in FIG. 9 reference symbols of nodes and capacitors are represented by identical reference symbols to those of FIG. 5.

Different points of the comparator 200C of FIG. 9 from the comparator 200B of FIG. 9 reside in that in the mirror circuit 230A, the diode-connected NMOS transistor NT234 is removed, instead of the NMOS transistor NT235, a PMOS transistor PT235 is used as a gate input transistor, and the gate of the PMOS transistor PT235 is connected not to the output node DN221 of the second amplifier 220B but to the output node ND212 of the first amplifier 210B.

Also in this case, a logical threshold value of a circuit parallel to the second amplifier 220B is required to set to the same as that of the second amplifier 220B.

According to the comparator 200C of FIG. 9, similar effects to those of the comparator 200A of FIG. 7 can be obtained.

As described above, according to embodiments of the present invention, the solid-state imaging device includes the pixel unit 110 including a plurality of pixels for photoelectrical conversion disposed in a matrix shape and the pixel signal readout circuit (ADC group) 150 for reading out data in a row unit from the pixel unit 110. The ADC group 150 is disposed in correspondence with the column array, and has a plurality of comparators 151 each for comparing a read-out signal potential with a reference to generate a determination signal and outputting the determination signal, and a plurality of counters 152 each for counting a comparison time of a corresponding comparator. The comparator 151 includes the first amplifier 210 and second amplifier 220 connected in cascade and the mirror circuit 230 connected in parallel with the second amplifier 220, the mirror circuit being applied as its gate input a voltage obtained through AZ (initialization) and sampling at a start of row operation to determine an operating point at each column. An output level of the second amplifier is detected to control the mirror circuit 230 and suppress an analog power supply change, or an output of the first amplifier 210 is used as a gate input to the parallel mirror circuit 230A and a logical threshold value of the mirror circuit is adjusted to control the mirror circuit and suppress an analog power supply change. Accordingly, the following effects can be obtained.

Namely, for AZ, the mirror circuit turns off after the cross between the RAMP waveform of the P- and D-phases and a pixel signal, and turns on before the cross between the RAMP waveform of the P/D phase and a pixel signal. Therefore, a steady current of the comparator is constant not depending upon bright/dark.

As a result, it is possible to reduce an analog power supply fluctuation by provision of constant current, reduce fixed/random vertical lines due to the fluctuation, and improve streaking.

An analog power supply fluctuation caused by glitch generated corresponding to a switching delay difference between gate input transistors (e.g., PMOS transistors PT221 and PT233 of FIG. 5) of the second amplifier and mirror circuit, may AC-couple the RAMP waveform and the nodes ND213, ND214, and ND222, of the comparator 200 with high impedance (HiZ). However, coupling to the RAMP waveform is associated with swing-return so that convergence of the ramp waveform becomes fast and a light amount dependency characteristics of streaking is expected to be improved, although improvement on a peak value of streaking is indefinite.

Furthermore, offset components of a signal caused by coupling to the nodes ND213, ND214, and ND222, with high impedance HiZ can be cancelled out because of a return of an analog power supply waveform.

The solid-state imaging device having the above-described effect may be applied to an imaging device for a digital camera and a video camera.

Figure 10:
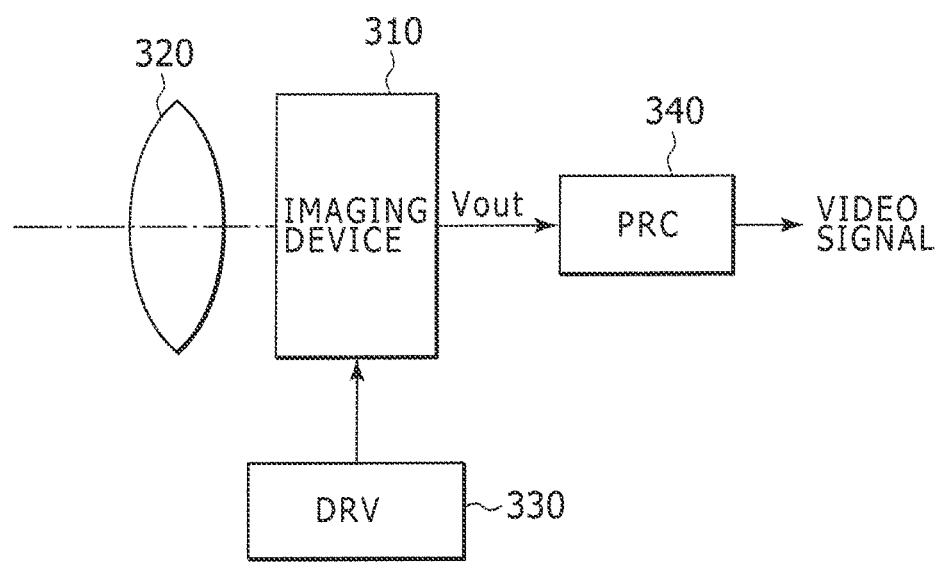
FIG. 10 is a view showing an example of the structure of a camera system to which the solid-state imaging device of the embodiment is applied.

FIG. 10 is a view showing an example of the structure of a camera system to which the solid-state imaging device of the embodiment is applied.

As shown in FIG. 10, the camera system 300 includes an imaging device 310 capable of adopting the solid imaging device 100 of the embodiment, an optical system for guiding an incident light to (forming an image of object) a pixel area of the imaging device 310, e.g., a lens 320 for focusing an incident light (image light), a drive circuit (DRV) 330 for driving the imaging device 310, and a signal processing circuit (PRC) 330 for processing an output signal from the imaging device 310.

The drive circuit includes a timing generator (not shown) for generating various timing signals including start pulses and clock pulses for driving circuits in the imaging device 310, and drives the imaging device 310 by using predetermined timing signals.

The signal processing circuit 340 performs predetermined signal processing for an output signal of the imaging device.

An image signal processed by the signal processing circuit 340 is recorded in a recording medium such as a memory. Image information recorded in the recording medium is hard-copied with a printer or the like. An image signal processed by the signal processing circuit 340 is displayed as moving images on a monitor such as a liquid crystal display.

As described above, in an imaging device such as a digital still camera, the solid-state imaging device 100 is mounted as the imaging device to realize a high precision camera.

Although there has been shown herein and described certain embodiments of the invention, it will be understood that many changes and modifications may be made therein without departing from the spirit or scope of the invention.

The invention claimed is:

1. An imaging device comprising:
a pixel circuit; and
a pixel signal readout circuit including a comparator, the comparator comprising:
a first circuit including a first transistor that receives a pixel signal from the pixel circuit, a second transistor that receives a reference signal, and a third transistor, one of a source and a drain of the third transistor being coupled to the first transistor and the second transistor, and the other of the source and the drain of the third transistor being coupled to a first fixed voltage line; and
a second circuit including a fourth transistor coupled to the first circuit and a second fixed voltage line, a fifth transistor coupled to the fourth transistor in series and the first fixed voltage line, a sixth transistor coupled to a gate of the fifth transistor and a drain or a source of the fifth transistor, a seventh transistor coupled to the second fixed voltage line, and an eighth transistor coupled to the seventh transistor and the first fixed voltage line,
wherein a gate of the third transistor is configured to receive a control signal.

2. The imaging device according to claim 1, wherein the one of a drain or a source of the third transistor is coupled to one of a drain or a source of the first transistor, and the one of a drain or a source of the third transistor is coupled to one of a drain or a source of the second transistor.

3. The imaging device according to claim 1, wherein the first fixed voltage is lower than the second fixed voltage.

4. The imaging device according to claim 1, wherein a gate of the fourth transistor is coupled to the first circuit.

5. The imaging device according to claim 1, wherein the first circuit is configured to perform a comparison operation of the pixel signal and the reference signal.

6. The imaging device according to claim 5, wherein the second circuit is configured to output a determination signal according to a result of the comparison operation performed by the first circuit.

7. The imaging device according to claim 1, wherein a gate of the first transistor is configured to receive the pixel signal, and a gate of the second transistor is configured to receive the reference signal.

8. The imaging device according to claim 1, wherein the fourth transistor has a first conductivity type; and the first, second, third, fifth, sixth, and seventh transistors respectively have a second conductivity type.

9. The imaging device according to claim 8, wherein the first conductivity type is a P-type and the second conductivity type is an N-type.

10. The imaging device according to claim 1, wherein the second circuit has a current mirror circuit.

11. An imaging device comprising:
a pixel circuit; and
a pixel signal readout circuit including a comparator, the comparator comprising:
a first circuit including a first transistor that receives a pixel signal from the pixel circuit, a second transistor that receives a reference signal, and a third transistor, one of a source or a drain of the third transistor being coupled to the first transistor and the second transistor, and the other of the source or the drain of the third transistor being coupled to a first fixed voltage line; and
a second circuit including a fourth transistor coupled to the first circuit and a second fixed voltage line, a fifth transistor coupled to the fourth transistor in series and the first fixed voltage line, a sixth transistor coupled to a gate of the fifth transistor and a drain or a source of the fifth transistor,
wherein a gate of the third transistor is configured to receive a control signal.

12. The imaging device according to claim 11, wherein the one of a drain or a source of the third transistor is coupled to one of a drain or a source of the first transistor, and the one of a drain or a source of the third transistor is coupled to one of a drain or a source of the second transistor.

13. The imaging device according to claim 11, wherein the first fixed voltage is lower than the second fixed voltage.

14. The imaging device according to claim 11, wherein a gate of the fourth transistor is coupled to the first circuit.

15. The imaging device according to claim 11, wherein the first circuit is configured to perform a comparison operation of the pixel signal and the reference signal.

16. The imaging device according to claim 15, wherein the second circuit is configured to output a determination signal according to a result of the comparison operation performed by the first circuit.

17. The imaging device according to claim 11, wherein a gate of the first transistor is configured to receive the pixel signal, and a gate of the second transistor is configured to receive the reference signal.

18. The imaging device according to claim 11, wherein the fourth transistor has a first conductivity type; and the first, second, third, fifth, sixth, and seventh transistors respectively have a second conductivity type.

19. The imaging device according to claim 18, wherein the first conductivity type is a P-type and the second conductivity type is an N-type.

20. The imaging device according to claim 11, wherein the second circuit has a current mirror circuit.

21. A solid-state imaging device comprising:
a pixel circuit; and
a pixel signal readout circuit including a comparator, the comparator including:
a first transistor that receives a pixel signal from the pixel circuit;
a second transistor that receives a reference signal;
a third transistor, one of a source or a drain of the third transistor being coupled to the first transistor and the second transistor, and the other of the source or the drain of the third transistor being coupled to a first fixed voltage;
a fourth transistor, a gate of the fourth transistor being coupled to the second transistor and one of a source or a drain being coupled a second fixed voltage line;
a fifth transistor coupled to the fourth transistor in series and the first fixed voltage line; and a sixth transistor coupled to a gate of the fifth transistor and a drain or a source of the fifth transistor, wherein a gate of the third transistor is configured to receive a control signal.

22. The imaging device according to claim 21, wherein the one of a drain or a source of the third transistor is coupled to one of a drain or a source of the first transistor, and the one of a drain or a source of the third transistor is coupled to one of a drain or a source of the second transistor.

23. The imaging device according to claim 21, wherein the first fixed voltage is lower than the second fixed voltage.

24. The imaging device according to claim 21, wherein a gate of the first transistors configured to receive the pixel signal, and a gate of the second transistors configured to receive the reference signal.

25. The imaging device according to claim 21, wherein the fourth transistor has a first conductivity type; and the first, second, third, fifth, and sixth transistor respectively have a second conductivity type.

26. The imaging device according to claim 25, wherein the first conductivity type is a P-type and the second conductivity type is an N-type.

\* \* \* \* \*